(12) United States Patent
Darwish et al.

(10) Patent No.: US 6,190,425 B1
(45) Date of Patent: Feb. 20, 2001

(54) MEMORY BAR AND RELATED CIRCUITS AND METHODS

(75) Inventors: Rashwan B. Darwish, Irvine; Trung Huynh, Santa Ana, both of CA (US)

(73) Assignee: Zomaya Group, Inc., Irvine, CA (US)

( * ) Notice: Under 35 U.S.C. 154(b), the term of this patent shall be extended for 0 days.

(21) Appl. No.: 09/309,339

(22) Filed: May 11, 1999

Related U.S. Application Data

(63) Continuation-in-part of application No. 09/185,276, filed on Nov. 3, 1998.

(51) Int. Cl.[7] .............................. H01L 21/00; H01L 21/64
(52) U.S. Cl. ............................................................. 29/25.01
(58) Field of Search ............................................. 29/25.01

(56) References Cited

U.S. PATENT DOCUMENTS

| | | | |
|---|---|---|---|
| 3,184,649 | 5/1965 | Singletary | 317/101 |
| 3,267,334 | 8/1966 | Wulc | 317/101 |
| 3,340,439 | 9/1967 | Henschen et al. | 317/101 |
| 3,372,308 | 3/1968 | Noschese et al. | 317/101 |
| 3,495,134 | 2/1970 | Collins et al. | 317/101 |
| 4,137,559 | 1/1979 | Reuting | 361/331 |
| 4,688,864 | 8/1987 | Sorel | 439/74 |
| 4,770,640 | 9/1988 | Walter | 439/69 |
| 4,956,694 | 9/1990 | Elde | 357/74 |
| 4,956,746 | 9/1990 | Gates et al. | 361/385 |
| 4,996,587 | 2/1991 | Hinrichsmeyer et al. | 357/74 |
| 5,028,986 | 7/1991 | Sugano et al. | 357/75 |
| 5,128,831 | 7/1992 | Fox et al. | 361/396 |
| 5,198,888 | 3/1993 | Sugano et al. | 257/686 |
| 5,241,454 | 8/1993 | Ameen et al. | 361/744 |
| 5,266,912 | 11/1993 | Kledzik | 333/247 |
| 5,343,075 | 8/1994 | Nishino | 257/686 |
| 5,343,366 | 8/1994 | Cipolla et al. | 361/785 |
| 5,371,654 | 12/1994 | Beaman et al. | 361/744 |
| 5,373,189 | 12/1994 | Massit et al. | 257/686 |
| 5,394,303 | 2/1995 | Yamaji | 361/749 |
| 5,397,747 | 3/1995 | Angiulli et al. | 437/209 |
| 5,397,916 | 3/1995 | Normington | 257/686 |
| 5,434,745 | 7/1995 | Shokrgozar | 361/735 |
| 5,440,181 | 8/1995 | Gruender et al. | 307/156 |
| 5,455,740 | 10/1995 | Burns | 361/735 |
| 5,481,134 | 1/1996 | Sobhani et al. | 257/686 |
| 5,491,304 | 2/1996 | Lau et al. | 174/264 |
| 5,493,476 | 2/1996 | Burns | 361/735 |
| 5,514,907 | 5/1996 | Moshayedi | 257/723 |
| 5,579,207 | 11/1996 | Hayden et al. | 361/790 |
| 5,581,498 | 12/1996 | Ludwig et al. | 365/63 |
| 5,594,275 | 1/1997 | Kwon et al. | 257/686 |
| 5,600,541 | 2/1997 | Bone et al. | 361/707 |
| 5,608,265 | 3/1997 | Kitano et al. | 257/738 |
| 5,625,221 | 4/1997 | Kim et al. | 257/686 |
| 5,656,856 | 8/1997 | Kweon | 257/686 |
| 5,677,569 | 10/1997 | Choi et al. | 257/686 |
| 5,699,234 | 12/1997 | Saia et al. | 361/790 |
| 5,701,233 | 12/1997 | Carson et al. | 361/735 |
| 5,723,903 | 3/1998 | Masuda et al. | 257/696 |
| 5,744,827 | 4/1998 | Jeong et al. | 257/686 |
| 5,781,415 | 7/1998 | Itoh | 361/790 |
| 5,783,870 | 7/1998 | Mostafazadeh | 257/791 |
| 5,804,872 | 9/1998 | Miyano et al. | 257/668 |
| 5,811,877 | 9/1998 | Miyano et al. | 257/706 |
| 5,818,107 | 10/1998 | Pierson et al. | 257/723 |
| 5,835,988 | 11/1998 | Ishii | 257/684 |
| 5,838,061 | 11/1998 | Kim | 257/686 |
| 5,861,666 | 1/1999 | Bellaar | 257/686 |
| 5,883,426 | 3/1999 | Tokuno et al. | 257/686 |
| 6,075,289 | * 6/2000 | Distefano . | |

FOREIGN PATENT DOCUMENTS

| | | |
|---|---|---|
| 4-209562 | 7/1992 | (JP) . |
| 6-77644 | 3/1994 | (JP) . |

\* cited by examiner

*Primary Examiner*—David E. Graybill
(74) *Attorney, Agent, or Firm*—Lyon & Lyon LLP

(57) ABSTRACT

A memory bar for use in high density memory modules. A memory bar comprises a substrate that provides a mounting for at least two IC chips, such that the substrate and associated IC chips may be mounted, for example, on one side of a memory module.

4 Claims, 7 Drawing Sheets

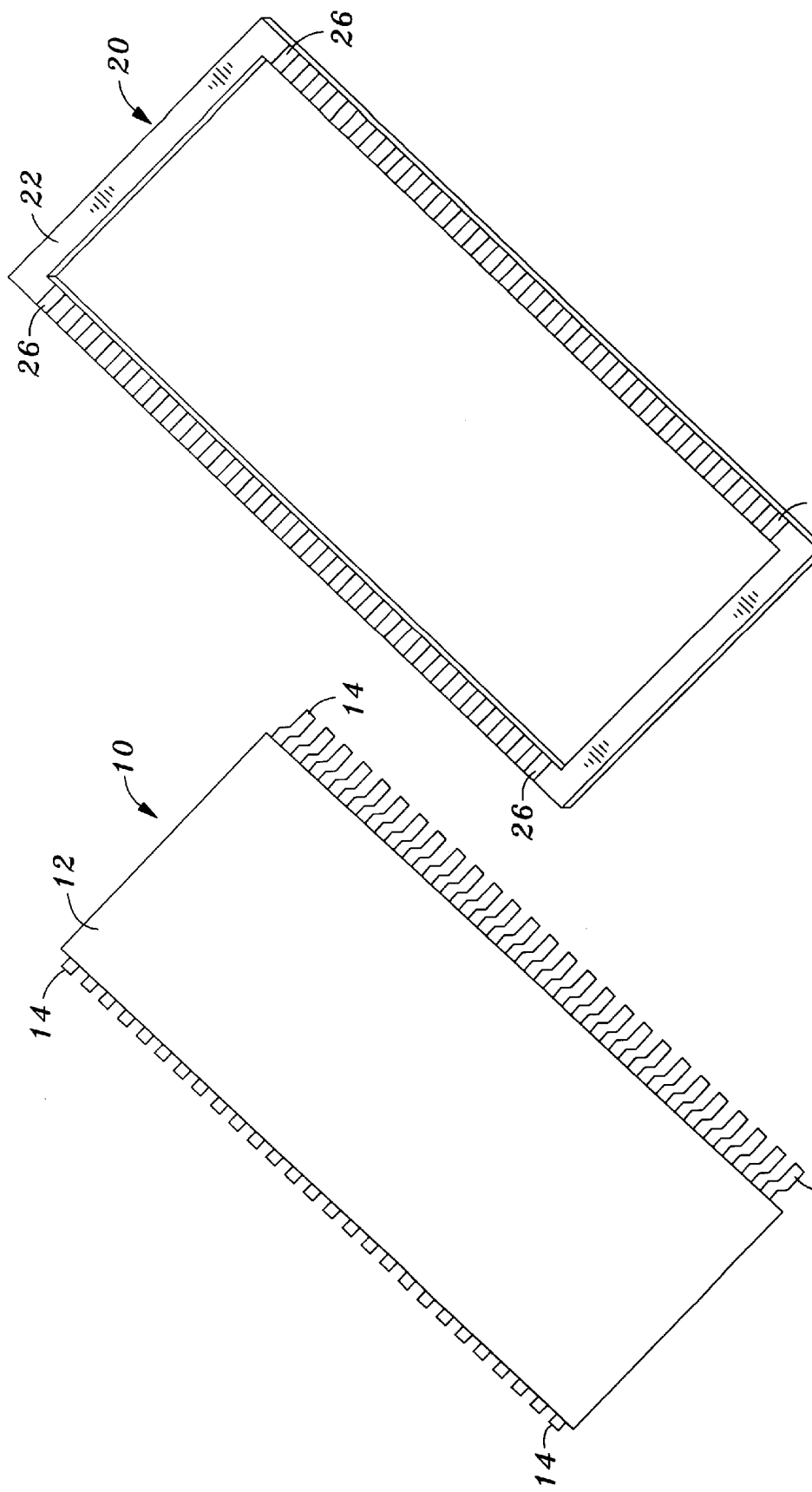

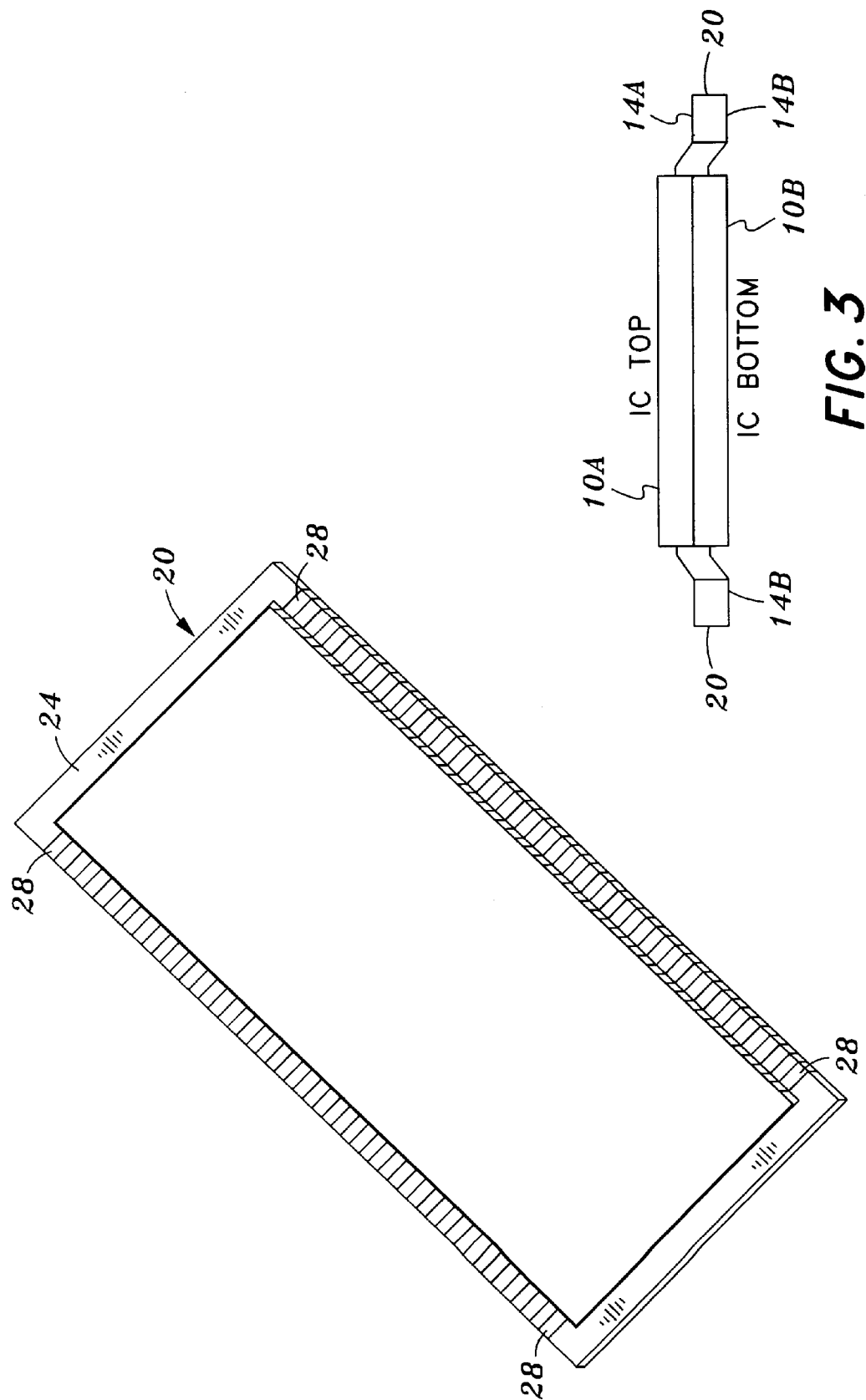

MEMORY BAR AND RELATED CIRCUITS AND METHODS

RELATED APPLICATION

This application is a continuation-in-part of application Ser. No. 09/185,276, filed Nov. 3, 1998, and entitled "Memory Bar and Related Circuits and Methods," the disclosure of which is hereby incorporated by reference.

BACKGROUND OF THE INVENTION

The present invention relates generally to memory devices and, more particularly, to a memory bar for use in expanding the capacity of, for example, a high density multichip module (MCM).

For the past several years, substantial attention has been directed to the field of memory modules including, for example, single inline memory modules (SIMMs) and dual inline memory modules (DIMMs). Such modules are useful, for example, in expanding the memory of a personal computer or other computing system, and the market for such modules is extremely competitive. In short, there is intense pressure within the memory module market to provide modules with increased capacity for less cost.

In view of the competitiveness of the memory module market, it is believed that those skilled in the art would find systems and methods for expanding the capacity of memory modules to be quite useful.

SUMMARY OF THE INVENTION

In one innovative aspect, the present invention is directed to a memory bar that may be used to dramatically increase the capacity of a high-density multichip memory module and to methods of manufacturing the same.

In one presently preferred embodiment, the memory bar provides a means for integrating numerous sets of identical dynamic random access memory (DRAM) integrated circuit packages by sandwiching the memory bar between respective pairs of packages. Moreover, by using a memory bar in accordance with the present invention, it is possible to literally double the memory capacity of conventional high density multichip modules such as DIMMs and SIMMs. The reason for this is that the use of a memory bar in accordance with the present invention allows for twice the number of memory chips to be mounted upon each side of a memory module.

A memory bar in accordance with the present invention may be viewed as a multichip carrier device. For example, the memory bar may comprise a printed circuit board structure having a plurality of land patterns provided on an upper surface and a lower surface thereof. The land patterns provided on the upper surface of the memory bar provide contacts for a first IC package, and the land patterns on the bottom surface of the memory bar provide contacts for a second IC package. In a preferred form, a gap of about 10 mils is provided between the top memory package and the bottom memory package. Such a gap allows for improved thermal dissipation by the resulting multi-chip memory structure. Once the IC chips are affixed to the memory bar, the memory bar may be mounted on, for example, one side of a dual inline memory module (DIMM), thus greatly increasing the amount of memory that is conventionally provided on one side of such a module. Of course, a similar memory bar structure may be used to increase the memory capacity on an opposite side of the dual inline memory module.

In another innovative aspect, the present invention is directed to a method of manufacturing a stacked memory product. In such an embodiment, a memory bar substrate is prepared, a first set of memory chips is placed on one side of the memory bar substrate and soldered into position, the memory bar substrate is inverted (or "flipped over"), a second set of memory chips is placed in an inverted orientation into the apertures provided within the memory bar substrate such that the chips within the second set are suspended within the apertures by their respective lead pins, and finally, the second set of memory chips is bonded to the memory bar substrate by soldering. In alternative embodiments, the first set of memory chips may be place in an inverted orientation within the apertures provided within the memory bar substrate, and the second set of chips may be placed on the memory bar in an upright position.

Accordingly, it is an object of the present invention to provide a memory bar for expanding the memory capacity of high-density memory modules.

It also is an object of the present invention to provide an innovative memory bar structure that is useful during the assembly of high-density memory modules.

Other objects and features of the present invention will become apparent from consideration of the following description taken in conjunction with the accompanying drawings.

BRIEF DESCRIPTION OF THE DRAWINGS

FIG. 1 is a plan view of a conventional integrated circuit memory package.

FIG. 2A is a plan view of a top surface of memory bar in accordance with a preferred embodiment of the present invention.

FIG. 2B is a plan view of a bottom surface of memory bar in accordance with a preferred embodiment of the present invention.

FIG. 3 is a cross-sectional view illustrating a pair of integrated circuit (IC) packages that are mounted on a memory bar in accordance with the present invention.

DETAILED DESCRIPTION OF PREFERRED EMBODIMENTS

Figure 4:
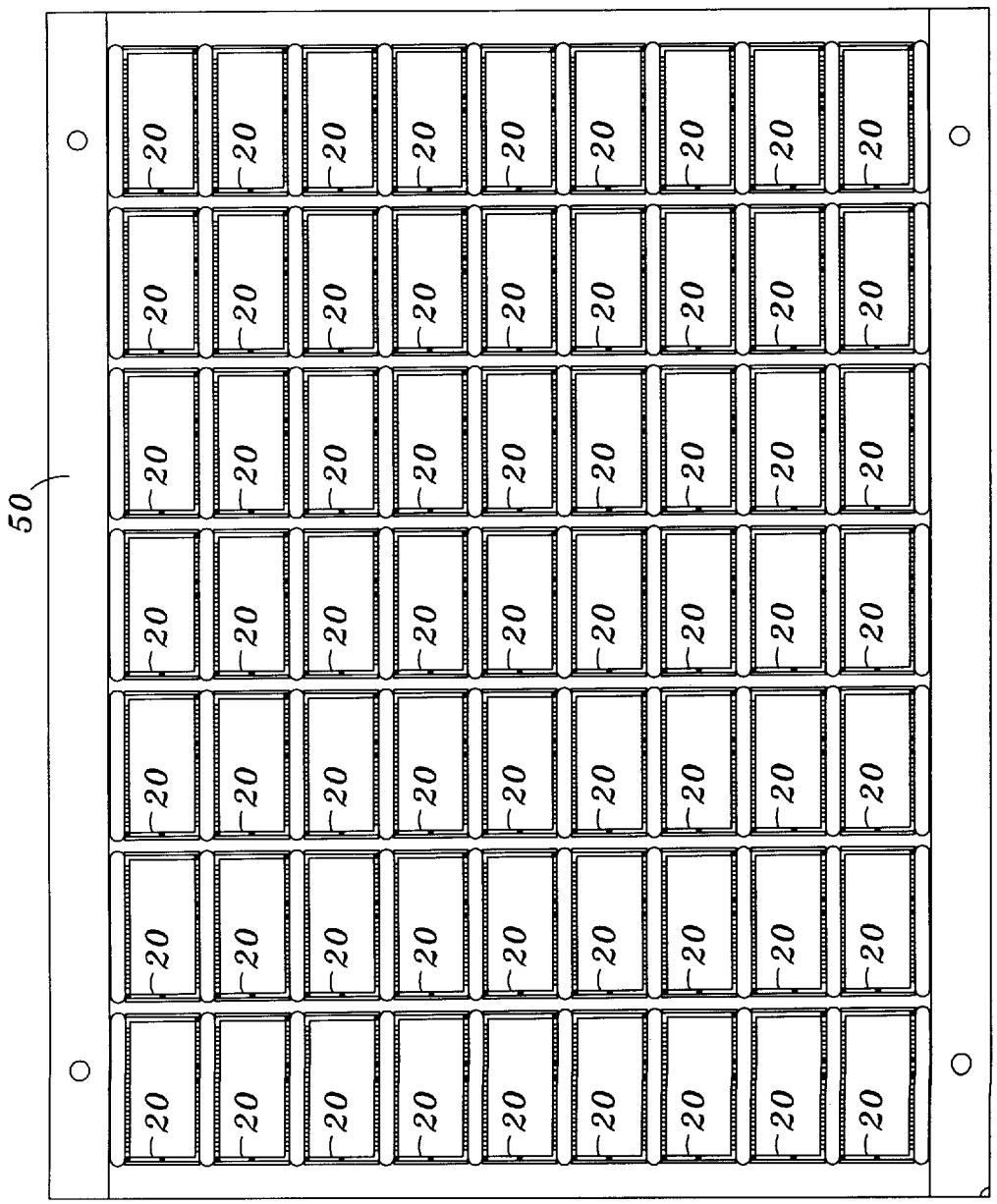
FIG. 4 is a top view of a memory bar substrate comprising 72 memory bar structures.
Figure 5C:
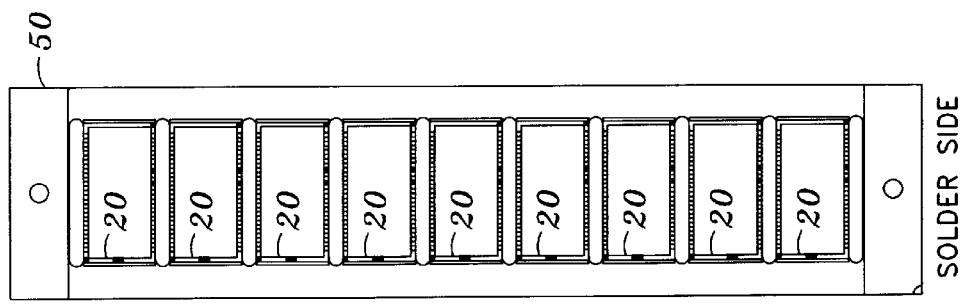
FIG. 5C is an illustration of a solder side layer of a memory bar substrate in accordance with the present invention.
Figure 5B:
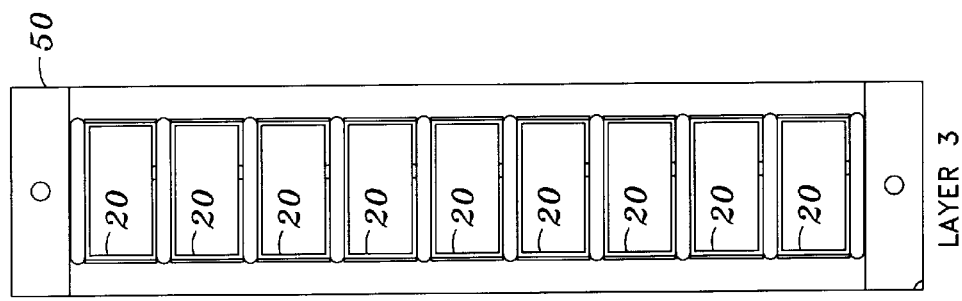
FIG. 5B is an illustration of an intermediate layer of a memory bar substrate in accordance with the present invention.
Figure 5A:
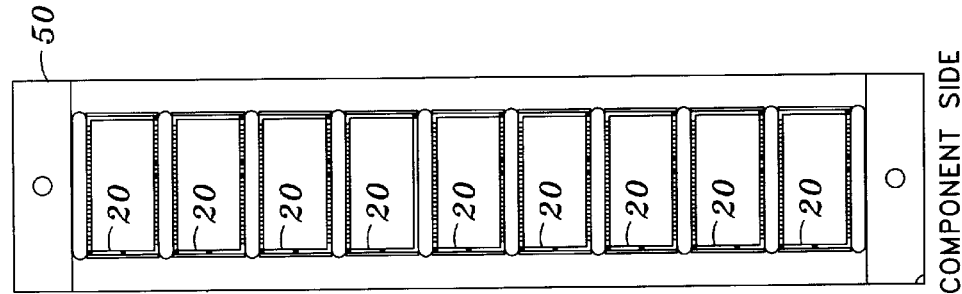
FIG. 5A is an illustration of a component side layer of a memory bar substrate in accordance with the present invention.
Figure 5D:
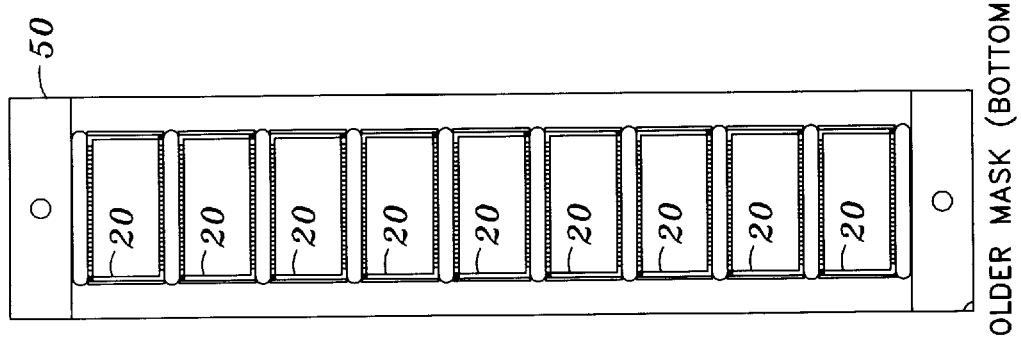
FIG. 5D is an illustration of a top solder mask for a memory bar substrate in accordance with the present invention.
Figure 5E:
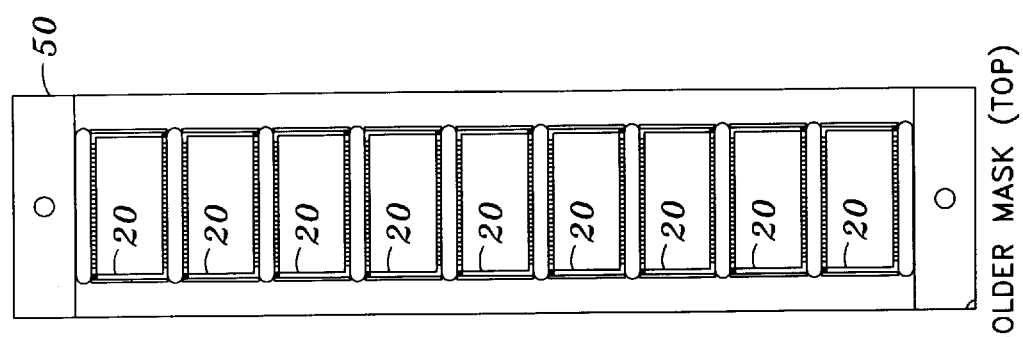
FIG. 5E is an illustration of a bottom solder mask for a memory bar substrate in accordance with the present invention.
Figure 5F:
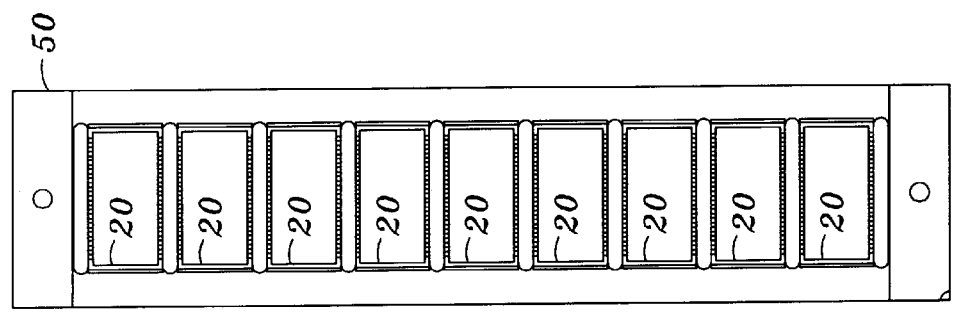
FIG. 5F is an illustration of a top solder paste for a memory bar substrate in accordance with the present invention.
Figure 5G:
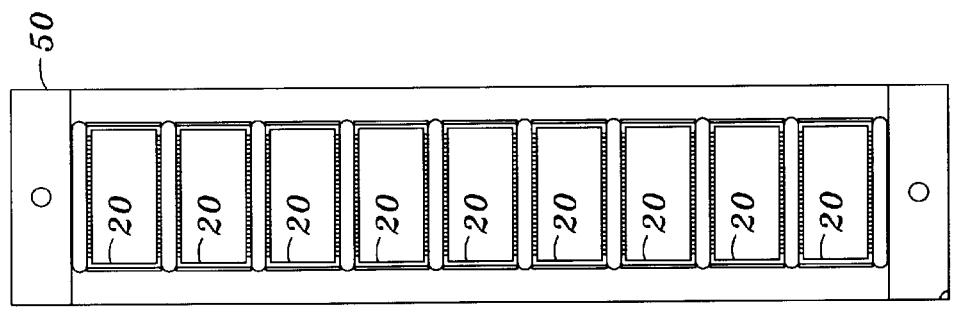
FIG. 5G is an illustration of a bottom solder paste for a memory bar substrate in accordance with the present invention.
Figure 5H:
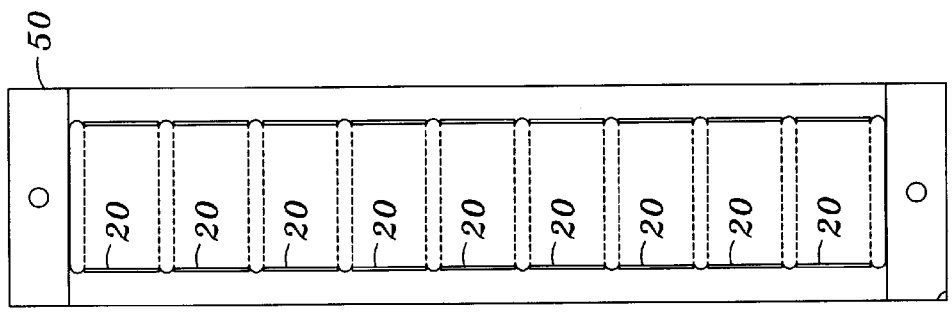
FIG. 5H is a drill drawing for a memory bar substrate in accordance with the present invention.

Turning now to the drawings, FIG. 1 provides an illustration of a conventional integrated circuit (IC) chip package 10 that may be mounted on a memory bar 20 (shown in FIG. 2) in accordance with the present invention. The IC chip package 10 includes a package body 12 and a plurality of conductive leads 14. The conductive leads 14 are designed, for example, to be bonded by soldering to a plurality of land patterns (not shown) provided on a printed circuit board.

Turning now to FIGS. 2A and 2B, a memory bar 20 in accordance with the present invention has a top surface 22 and a bottom surface 24 whereon a plurality of land patterns 26 and 28 are provided. The land patterns 26 and 28 provide a means for mounting a pair of IC chips 10 on the memory bar 20, as shown in FIG. 3.

Moreover, as shown in FIG. 3, when mounted on a memory bar 20, a pair of IC packages 10a and 10b preferably are arranged or aligned to have the same electrical polarity. Further, in one particularly preferred embodiment, a gap (not shown) of about 10 mils is provided between the top IC package 10a and the bottom IC package 10b. The gap (not shown) is provided to enhance thermal dissipation from the combined memory structure.

Figure 6A:
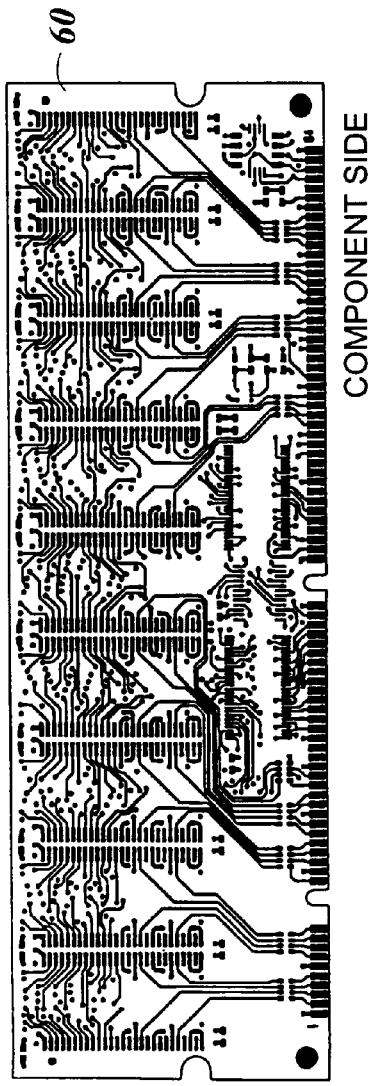
FIG. 6A is an illustration of a component side of a high density multichip module (MCM) that may have mounted thereon a plurality of populated memory bars in accordance with the present invention.
Figure 6B:
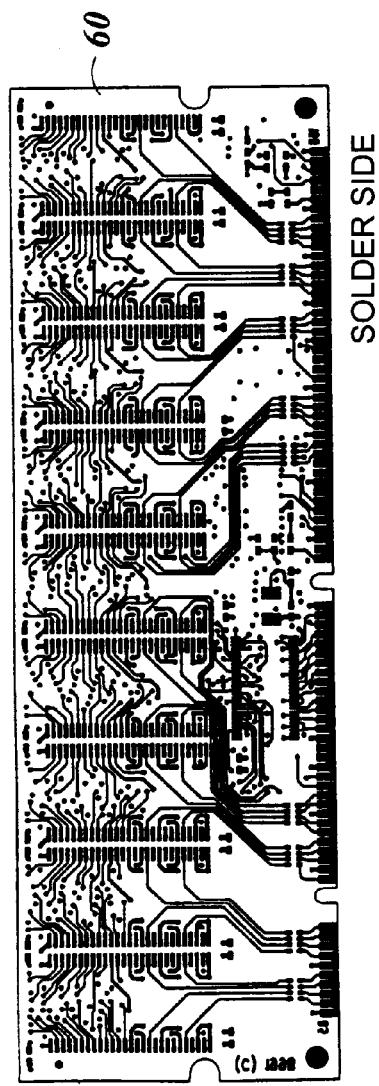
FIG. 6B is an illustration of a solder side of a high density multichip module (MCM) that may have mounted thereon a plurality of populated memory bars in accordance with the present invention.

Turning now to FIG. 4, when assembling memory modules, a memory bar substrate 50 is preferably utilized. The memory bar substrate 50 preferably includes eight rows or sub-groups of memory bar units 20, wherein each sub-group includes, for example, nine memory bars 20 of the type illustrated in FIGS. 2A, 2B and 3. Further, those skilled in the art will appreciate that, when assembling high density memory modules, pairs of integrated circuit chips 10 preferably are mounted on the respective memory bars 20 comprising the substrate 50 prior to disassembly or cleavage of the substrate 50. Moreover, conventional pick-and-place equipment may be easily utilized to populate the memory bar substrate 50 and, thereafter, the substrate 50 may be cut to provide eight groups of populated memory bar subunits for mounting, for example, on a memory module substrate 60, such as that shown in FIGS. 6A and 6B. When placing pairs of IC chips 10 within a memory bar substrate 50, a high temperature solder paste is applied, for example, to the land patterns 28 provided on the bottom surface 24 of the memory bar substrate 50. Then, a first set of IC chips 10b is seated within the memory bar substrate 50 in such a manner that the top surfaces (not shown) of the IC chips face downward within the memory bars 20 comprising the memory bar substrate 50. It is believed by the inventors hereof that using a pick-and-place machine to place chips within the cavities provided within a memory bar substrate 50 is particularly innovative, because that allows for stacked memory bar pairs to be created using only a single memory bar 20 as an interconnecting structure. It will be appreciated that, to do this, the pick-and-place machine generally must be configured to pick-and-place chips in an inverted orientation (i.e., must pick the chips up in an inverted orientation, and place the inverted chips within the cavities provided within the memory bar substrates 50). Thus, a conventional pick-and-place machine may be used to seat the IC chips 10b within the memory bars 20. Once IC chips 10b have been seated within each of the memory bars 20 comprising the substrate 50, the substrate 50 and IC chips 10b are placed in an oven and heated, for example, to a temperature of 275° C. to melt the applied solder paste and adhere the leads 14b of the IC chips 10b to the land patterns 28 of the memory bars 20. The substrate 50 and IC chips 10b are then allowed to cool causing the IC chips 10b to be bonded to the memory bar substrate 50. After cooling, solder paste is applied to the land patterns 26 provided on the top surface 22 of the substrate 50, and a second set of IC chips 10a is placed on the memory bar substrate 50. In this instance, the IC chips 10a are place on the substrate 50 with their top surfaces (not shown) facing in an upward direction. Again, once the IC chips 10a are properly positioned, the substrate 50 and IC chips 10a and 10b are placed in an oven and heated, again, to substantially 275° C. The substrate 50 and IC chips 10a and 10b are then allowed to cool, and the memory bar substrate 50 may be cut or broken apart creating a plurality of stacked memory modules, each comprising a memory bar 20 and two (2) IC chips 10a and 10b.

FIGS. 5A–5H provide an illustration o f the various layers, masks and pastes that are utilized in forming a memory bar substrate 50 in accordance with the present invention. The illustrations of the layers, masks and pastes provided in FIGS. 5A–5H will be readily understood by those skilled in the art. Accordingly, a detailed discussion of the various layers, masks and pastes is not provided herein. However, it should be appreciated that the majority of land patterns 26 and 28 provided, respectively, on the top surface 22 and bottom surface 24 of the memory bar 20 are interconnected by metal traces (not shown) provided within the memory bar 20. Further, chip selection traces (not shown) are provided within each memory bar 20 to allow for selective operation of the IC chips 10a and 10b that are mounted on the memory bar 20. Those skilled in the art will appreciate that, while the memory bar units 20 described above provide a mounting for only two IC packages, it would be possible in accordance with the present invention to assemble memory bar units capable of accommodating additional IC packages. For example, if it were desired to create a "double bar," a pair of populated memory bar units 20 might be mounted one on top of the other and, thereafter, mounted on a surface of a memory module. In such an embodiment, a resulting memory module might have four times the memory capacity of conventional modules. However, those skilled in the art will appreciate that the utility of multi-layered memory bar designs might be limited by the extent to which the memory bar structure extends from the surface of the module substrate and, possibly, by the availability of unused pins or leads on the utilized IC packages, as it is the use of such pins or leads that allows for the selection of a particular IC circuit within a memory pair in the presently preferred embodiments.

While the invention is susceptible to various modifications and alternative forms, specific examples thereof have been shown in the drawings and are herein described in detail. It should be understood, however, that the invention is not to be limited to the particular forms or methods disclosed, but to the contrary, the invention is to cover all modifications, equivalents, and alternatives falling within the spirit and scope of the appended claims.

What is claimed is:

1. A method of manufacturing a stacked memory product, said method comprising the steps of:
   using a pick-and-place machine, placing a first set of memory chips in an inverted position within a plurality of cavities provided within a memory bar substrate;
   soldering the placed first set of memory chips in a first set of predetermined positions;
   turning the memory bar substrate over;
   using a pick-and-place machine, placing a second set of memory chips in an upright position on said memory bar substrate; and
   soldering the placed second set of memory ships in a second set of predetermined positions.

2. The method of claim 1, wherein said first set of memory chips is placed and soldered before said second set of memory chips is placed and soldered.

3. The method of claim 1, wherein said second set of memory chips is placed and soldered before said first set of memory chips is placed and soldered.

4. A method of manufacturing a stacked memory product, said method comprising the steps of:
   using a pick-and-place machine, placing a first set of memory chips in a first set of predetermined positions on a memory bar substrate; soldering the placed first set of memory chips in said first set of predetermined positions;
   turning the memory bar substrate over;
   using a pick-and-place machine, placing a second set of memory chips in an inverted orientation within a plurality of apertures provided within said memory bar substrate, such that pins provided on said second set of memory chips are positioned within a second set of predetermined positions on said memory bar substrate; and
   soldering the pins of said second set of memory ships in said second set of predetermined positions.

* * * * *